(12) United States Patent
Jan et al.

(10) Patent No.: US 8,710,603 B2
(45) Date of Patent: Apr. 29, 2014

(54) ENGINEERED MAGNETIC LAYER WITH IMPROVED PERPENDICULAR ANISOTROPY USING GLASSING AGENTS FOR SPINTRONIC APPLICATIONS

(75) Inventors: Guenole Jan, San Jose, CA (US);
Yu-Jen Wang, San Jose, CA (US);
Ru-Ying Tong, Los Gatos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/408,555

(22) Filed: Feb. 29, 2012

(65) Prior Publication Data

US 2013/0221459 A1     Aug. 29, 2013

(51) Int. Cl.
*H01L 29/82* (2006.01)

(52) U.S. Cl.
USPC ............................ 257/421; 257/441; 438/3

(58) Field of Classification Search
USPC ..................................... 257/421, 441; 438/3
See application file for complete search history.

(56) References Cited

U.S. PATENT DOCUMENTS

| | | | |
|---|---|---|---|
| 6,166,948 A | 12/2000 | Parkin et al. | |
| 6,614,630 B2 | 9/2003 | Horng et al. | |
| 7,635,902 B2 | 12/2009 | Rizzo et al. | |
| 7,666,467 B2 | 2/2010 | Parkin | |
| 7,973,351 B2 | 7/2011 | Marukame et al. | |
| 8,183,653 B2 * | 5/2012 | Peng et al. | 257/421 |
| 2003/0184921 A1 | 10/2003 | Sugita et al. | |
| 2005/0264952 A1 * | 12/2005 | Oshima | 360/324.11 |
| 2008/0191295 A1 | 8/2008 | Ranjan et al. | |
| 2008/0278867 A1 * | 11/2008 | Fukumoto et al. | 360/324.12 |
| 2009/0122450 A1 * | 5/2009 | Wang et al. | 360/324.2 |
| 2010/0096716 A1 | 4/2010 | Ranjan et al. | |
| 2011/0006384 A1 | 1/2011 | Peng et al. | |
| 2011/0018647 A1 * | 1/2011 | Lee et al. | 331/154 |
| 2011/0032644 A1 | 2/2011 | Watts et al. | |
| 2012/0025338 A1 * | 2/2012 | Ranjan et al. | 257/421 |
| 2012/0068285 A1 | 3/2012 | Kitagawa et al. | |
| 2013/0119495 A1 * | 5/2013 | Vetr et al. | 257/421 |

OTHER PUBLICATIONS

PCT Search Report, PCT/US12/70321, Mail date—Mar. 4, 2013.
"A perpendicular-anisotropy CoFeB-MgO magnetic tunnel junction," by S. Ikeda et al., nature materials Letters, published online: Jul. 11, 2010, DOI: 10.1038/NMAT2804, www.nature.com/naturematerials, pp. 1-4.

(Continued)

*Primary Examiner* — David Vu
*Assistant Examiner* — Brandon Fox
(74) *Attorney, Agent, or Firm* — Saile Ackerman LLC; Stephen B. Ackerman

(57) ABSTRACT

A magnetic element is disclosed wherein first and second interfaces of a free layer with a perpendicular Hk enhancing layer and tunnel barrier, respectively, produce enhanced surface perpendicular anisotropy to increase thermal stability in a magnetic tunnel junction (MTJ). The free layer may be a single layer or a composite and is comprised of one or more glassing agents that have a first concentration in a middle portion thereof and a second concentration less than the first concentration in regions near first and second interfaces. As a result, a CoFeB free layer, for example, selectively crystallizes along first and second interfaces but maintains an amorphous character in a middle region containing a glass agent providing the annealing temperature is less than the crystallization temperature of the middle region. The magnetic element may be part of a spintronic device or serve as a propagation medium in a domain wall motion device.

41 Claims, 4 Drawing Sheets

(56) References Cited

OTHER PUBLICATIONS

"Current-driven excitation of magnetic multilayers," by J.C. Slonczewski, Journal of Magnetism and Magnetic Materials 159 (1996) L1-L7, Elsevier.

"Growth, structure, electronic, and magnetic properties of MgO/Fe(001) bilayers and Fe/MgO/Fe(001) trilayers," by M. Klaua et al, Physical Review B., vol. 64, 134411, 2001 The American Physcial Society, 64 134411-1 to 134411-8, University of Nebraska—Lincoln, Research Papers in Physics and Astronomy, Axel Enders Publication.

PCT Search Report, PCT/US2013/050190, Mailed: Oct. 28, 2013.

* cited by examiner

| Element | Oxide | Free energy of formation per mol of $O_2$ ($\times 10^{-6}$ J.kmol-1) |
|---|---|---|
| Au | $Au_2O_3$ | 109 |
| Ag | $Ag_2O_3$ | -7 |
| Ru | $RuO_2$ | -253 |
| Cu | CuO | -254 |
| Co | CoO | -426 |
| Ni | NiO | -432 |
| Fe | FeO | -488 |
| Fe | $Fe_2O_3$ | -495 |
| Mo | $MoO_2$ | -502 |
| W | $WO_3$ | -509 |
| Sn | SnO | -514 |
| Zn | ZnO | -636 |
| Cr | $Cr_2O_3$ | -699 |
| Nb | $Nb_2O_5$ | -708 |
| Ta | $Ta_2O_5$ | -788 |
| B | $B_2O_3$ | -796 |
| Si | $SiO_2$ | -805 |
| Mn | $Mn_2O_3$ | -854 |
| Ti | $TiO_2$ | -890 |
| Zr | $ZrO_2$ | -1037 |
| Al | $Al_2O_3$ | -1053 |
| Ba | BaO | -1056 |
| Hf | $HfO_2$ | -1084 |
| Mg | MgO | -1146 |
| Ca | CaO | -1208 |

ENGINEERED MAGNETIC LAYER WITH IMPROVED PERPENDICULAR ANISOTROPY USING GLASSING AGENTS FOR SPINTRONIC APPLICATIONS

TECHNICAL FIELD

The present disclosure relates to a magnetic tunnel junction element comprised of at least one ferromagnetic layer or multilayer exhibiting perpendicular magnetic anisotropy (PMA) wherein the ferromagnetic layer is doped with a glassing agent to retain an amorphous character in a center region thereof and thereby reduce crystalline anisotropy and provide a higher PMA for a given magnetic moment along with higher thermal stability for the device.

BACKGROUND

Magnetoresistive Random Access Memory (MRAM), based on the integration of silicon CMOS with magnetic tunnel junction (MTJ) technology, is a major emerging technology that is highly competitive with existing semiconductor memories such as SRAM, DRAM, and Flash. Similarly, spin-transfer (spin torque) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale.

Both field-MRAM and STT-MRAM have a MTJ element based on a tunneling magneto-resistance (TMR) effect wherein a stack of layers has a configuration in which two ferromagnetic layers are separated by a thin non-magnetic dielectric layer. One of the ferromagnetic layers has a magnetic moment that is pinned in a first direction while the other ferromagnetic layer has a magnetic moment which is free to rotate in a direction that is either parallel or anti-parallel to the first direction. As the size of MRAM cells decreases, the use of external magnetic fields generated by current carrying lines to switch the magnetic moment direction of the free layer becomes problematic. One of the keys to manufacturability of ultra-high density MRAMs is to provide a robust magnetic switching margin by eliminating the half-select disturb issue. For this reason, a new type of device called a spin transfer (spin torque) device was developed. Compared with conventional MRAM, spin-transfer torque or STT-MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a current perpendicular to plane (CPP) configuration, the spin angular moment of electrons incident on a ferromagnetic layer interacts with magnetic moments of the ferromagnetic layer near the interface between the ferromagnetic layer and non-magnetic spacer. Through this interaction, the electrons transfer a portion of their angular momentum to the ferromagnetic free layer. As a result, spin-polarized current can switch the magnetization direction of the ferromagnetic free layer if the current density is sufficiently high, and if the dimensions of the multilayer are small.

For STT-MRAM to be viable in the 90 nm technology node and beyond, the ultra-small MTJs (also referred to as nano-magnets) must exhibit a magnetoresistive (MR) ratio that is much higher than in a conventional MRAM-MTJ which uses a NiFe free layer and AlOx as the tunnel barrier layer. Furthermore, the critical current density (Jc) must be lower than about $10^6$ A/cm$^2$ to be driven by a CMOS transistor that can typically deliver 100 µA per 100 nm gate width. A critical current for spin transfer switching (Ic), which is defined as $[(Ic^+ + Ic^-)/2]$, for the present 180 nm node sub-micron MTJ having a top-down oval shaped area of about 0.2×0.4 micron, is generally a few milliamperes. The critical current density (Jc), for example (Ic/A), is on the order of several $10^7$ A/cm$^2$. This high current density, which is required to induce the spin-transfer effect, could destroy a thin tunnel barrier made of AlOx, MgO, or the like. Thus, for high density devices such as STT-MRAM on a gigabit scale, it is desirable to decrease Ic (and its Jc) by approximately an order of magnitude so as to avoid an electrical breakdown of the MTJ device and to be compatible with the underlying CMOS transistor that is used to provide switching current and to select a memory cell.

Several schemes have been presented to use the spin transfer torque mechanism for magnetic based memory such as STT-MRAM, or current induced domain wall motion based MRAM, logic, and sensor applications. A preferred implementation is to employ a magnetic tunnel junction (MTJ) with a pinned ferromagnetic layer and free ferromagnetic layer separated by a tunneling oxide layer in a TMR configuration. Although this scheme has been widely studied, further improvements in overall performance are needed before a domain wall motion device is used commercially as a memory element in MRAM or as a sensor in hard disk drive (HDD) heads.

Referring to FIG. 1, the two magnetic layers in a TMR configuration can either have their magnetization pointing in the plane or out of the plane of the film. An example of in-plane magnetization is shown on side (a) of FIG. 1 where a pinned layer 10 has a magnetic moment along an x-axis and the free layer 12 has a magnetic moment free to rotate in a (+) or (−) x-axis direction. An insulating (tunnel barrier) layer 11 separates the aforementioned two ferromagnetic layers. Out of plane magnetization (PMA) is depicted on side (b) of FIG. 1 where pinned layer 20 has a magnetization pointing in a y-axis direction or perpendicular to the film plane and the free layer 21 has a magnetic moment that is free to rotate either in a (+) or (−) y-axis direction. In both examples, the free layer and pinned layer magnetizations are parallel or anti-parallel in a quiescent state. Thus, storage of the digital information as a "1" or "0" magnetic state is provided by the direction of magnetization in the free layer 12 (or 21).

In the case of a free layer having a magnetization direction perpendicular to the plane of the film, the critical current ($i_C$) required to switch the magnetic direction in the magnetic element is directly proportional to the perpendicular anisotropy field as shown in equation (1):

$$i_c = \frac{\alpha e M_s V H_{k_{\it eff},\perp}}{g\hbar} \quad (1)$$

where e is the electron charge, α is a Gilbert damping parameter, Ms is the saturation magnetization of the free layer, h is the reduced Plank's constant, g is the gyromagnetic ratio, $H_{k_{\it eff},\perp}$ is the out-of-plane anisotropy field of the magnetic region to switch, and V is the volume of the free layer. For most applications, the spin polarized current must be as small as possible.

Thermal stability is a function of the perpendicular anisotropy field as shown in equation (2):

$$\Delta = \frac{M_S V H_{k_{eff},\perp}}{2k_B T} \quad (2)$$

where $k_B$ is the Boltzmann constant and T is the temperature. In both of the in-plane and out-of-plane configurations represented in FIG. 1, the perpendicular anisotropy field of the magnetic element is expressed in equation (3) as:

$$H_{k_{eff},\perp} = -DM_s + \frac{2K_U^{\perp,s}}{M_s d} + H_{k,\chi} \quad (3)$$

where D (approximately $4\pi$) is the demagnetizing factor of the structure, $M_s$ is the saturation magnetization, d is the thickness of the magnetic element, $H_{k,\chi}$ is the crystalline anisotropy field, and $K_U^{\perp,s}$ is the surface perpendicular anisotropy of the top and bottom surfaces of the magnetic element. In polycrystalline materials where grains are randomly oriented, $H_{k,\chi}$ is the sum of the crystalline anisotropy of all the grains defining the region of interest. When the grains are large, $H_{k,\chi}$ can be significant whereas when the grains are small or the material is amorphous, this crystalline contribution to the total anisotropy field is small. From equation (3), one can see that the crystalline anisotropy of the material plays a detrimental role when the origin of the perpendicular anisotropy is mostly interfacial.

In the absence of strong crystalline anisotropy, the perpendicular anisotropy field of a magnetic layer is dominated by the shape anisotropy field on which little control is available. At a given thickness, lower magnetization saturation decreases shape anisotropy and the spin-polarized switching current but also decreases thermal stability which is not desirable. Therefore, an improved configuration for a magnetic element is needed that provides improved thermal stability for a free layer with perpendicular magnetic anisotropy. In other words, it is desirable to increase the perpendicular anisotropy field in a perpendicular-to-plane structure if one wants to increase thermal stability independently of moment or volume of the magnetic layer, and without affecting the critical current. There is presently no teaching as to how perpendicular magnetic anisotropy can be enhanced at first and second free layer interfaces with adjoining layers in a MTJ stack while selectively crystallizing portions of the free layer adjacent to these interfaces, and maintaining amorphous character (lower magnetic moment) in a middle portion of the free layer.

SUMMARY

One objective of the present disclosure is to provide a MTJ with one or both of a free layer and reference layer having perpendicular magnetic anisotropy (PMA) wherein a middle region of the magnetic layer remains amorphous while regions along interfaces with adjoining MTJ layers are selectively crystallized during annealing which results in higher thermal stability and tolerance to higher annealing temperatures.

A second objective of the present disclosure is to provide a MTJ according to the first objective wherein the materials used for the PMA layers are compatible with a variety of magnetic device applications including STT-MRAM, current induced domain wall motion based MRAM, logic, and read head sensors.

According to one embodiment, these objectives are achieved with a MTJ structure comprised of a pinned magnetic layer, a magnetic free layer (hereafter referred to as free layer), and a tunnel barrier layer formed between the pinned layer and free layer. The free layer has a first surface that forms a first interface with the tunnel barrier layer thereby inducing PMA in a first region of the free layer adjacent to the first interface. Moreover, there is preferably a perpendicular Hk enhancing layer that forms a second interface with a second surface of the free layer which faces away from the tunnel barrier and thereby induces PMA in a second region of the free layer that is adjacent to the second interface. Between the first and second regions is a middle or third region of the free layer which has an amorphous character that is maintained even at elevated annealing temperatures by the presence of one or more glassing agents such as Si, Ta, P, Nb, Hf, Ti, Pd, Be, Cr, Zr, Cu, Os, V, or Mg in a concentration of 1% to 30% of the ferromagnetic free layer. In one aspect, one or more glassing agents are codeposited or "doped" into the free layer which is comprised of a plurality of layers. In one embodiment that involves a bottom spin valve structure, the first through third regions may comprise three distinct layers in a composite free layer configuration. For example, the first region may be a CoFeB layer formed on the tunnel barrier, the second region may be a CoFeBG (or CoFeB:G) layer where G is a first glassing agent, and the third region may be a second CoFeB layer. B is considered to be a second glassing agent. Thus, the glassing agents are distributed such that a first or higher concentration (B+G) is formed in the middle region of the free layer and a second or lower concentration (B+G) is formed in the free layer proximate to the first and second interfaces. In the second concentration, G may be zero.

Another important factor is the diffusion coefficient of the one or more glassing agents. Preferably, Ta which has a low diffusion coefficient is not deposited proximate to the first or second interfaces. On the other hand, B has a relatively high diffusion coefficient and tends to migrate out of the first and third regions near the first and second interfaces thereby enabling a lower crystallization temperature in those regions.

In an alternative embodiment, there may be a plurality of "n" layers in the composite free layer wherein the bottom and top layers in the free layer stack have a lower concentration of glassing agents than the other "n–2" layers. Furthermore, the concentration of the glassing agents becomes greater with increasing distance from the first and second interface until the highest concentration is found in the middle one or more layers of the stack of "n" layers.

In an alternative embodiment, a glassing agent with a relatively low diffusion coefficient such as Ta is deposited in the form of one or more layers. For example, the free layer may be formed by sequentially depositing a first CoFeB layer, a Ta glassing agent layer with about a nanolayer thickness or less, and then a second CoFeB layer. Moreover, the glassing layer may be comprised of a plurality of layers that form a laminated structure with one or more glassing agents such as Ta/Mg/Ta, or Ta/Ta/Ta. It should be understood that during a subsequent annealing step, the glassing agent layer with low diffusion coefficient may form nano-crystals along the CoFeB grain boundaries. Since the nano-crystals typically have a size of less than 10 Angstrom diameter with randomly oriented magnetic moments, there is a net moment contribution=0 to the free layer magnetization. In this case, there is a continuous concentration gradient of glassing agent with a first or higher concentration at the middle of the free layer where both B and the low diffusion coefficient glassing agent are present to a second or lower concentration proximate to the first and second interfaces where there is only a small concentration, if any, of B present and none of the low diffusion coefficient glassing agent. Thus, the glassing agent concentration gradually increases as one approaches the middle of the free layer from either the first or second interfaces.

The free layer may be comprised of an alloy of Co, Fe, Ni, and B with a thickness between 5 and 25 Angstroms. Preferably, the free layer is thin enough so that the perpendicular surface anisotropy field is significant compared with the shape anisotropy field. Furthermore, the free layer may be engineered such that the interfacial perpendicular anisotropy dominates the anisotropy field in an out-of-plane magnetization configuration also known as a perpendicular magnetic anisotropy (PMA) structure. In one aspect, the MTJ may have a bottom spin valve structure represented by seed layer/AFM layer/pinned layer/tunnel barrier/free layer/Hk enhancing layer/capping layer.

The perpendicular Hk enhancing layer is made of any material that provides additional interfacial perpendicular anisotropy when contacting a surface of the free magnetic layer, and is formed on an opposite side of the free layer with respect to the tunnel barrier layer interface with the free layer. In a preferred embodiment, both of the tunnel barrier layer and perpendicular Hk enhancing layer are made of MgO. In this case, the thickness and oxidation state of the MgO perpendicular Hk enhancing layer are controlled to give a resistance×area (RA) product smaller than that of the tunnel barrier layer to minimize the reduction in the magnetoresistive (MR) ratio. In an alternative embodiment, the perpendicular Hk enhancing layer may be comprised of other oxides including SiOx, SrTiOx, BaTiOx, CaTiOx, LaAlOx, MnOx, VOx, AlOx, TiOx, and HfOx. In yet another embodiment, the perpendicular Hk enhancing layer may be one of Ru, Ta, Ti, B, V, Mg, Ag, Au, Cu or Cr. Moreover, an oxide perpendicular Hk enhancing layer may be embedded with conductive particles made of one or more of Fe, Co, Ni, Ru, Cr, Au, Ag, and Cu to lower the resistivity therein.

Preferably, the capping layer which is also referred to as the buffer layer is made of Ru. If the perpendicular Hk enhancing layer is an oxide, it is important to select a buffer layer to have a free energy of formation substantially higher than that of the Hk enhancing layer so that the buffer layer does not change the oxidation state of the Hk enhancing layer during an anneal step. In other words, the metal selected for the buffer layer should not attract oxygen from an oxide Hk enhancing layer during an anneal step which would undesirably decrease the induced perpendicular anisotropy at the interface of the free layer and perpendicular Hk enhancing layer.

Alternatively, the free layer may be formed below the tunnel barrier in a top spin valve structure represented by seed layer/Hk enhancing layer/free layer/tunnel barrier/pinned layer/AFM layer/capping layer. In this case, the seed layer is preferably Ru so that the seed layer has a free energy of oxide formation substantially less than that of a perpendicular Hk enhancing layer comprised of an oxide.

The present disclosure also anticipates that both of the free layer and pinned layer may be comprised of one or more glassing agents having a first or higher concentration in a middle region of the free layer and pinned layer, and a second or lower concentration in a region adjacent to interfaces formed with adjoining layers in the MTJ stack.

DETAILED DESCRIPTION

The present disclosure is a magnetic tunnel junction (MTJ) element in which one or both of a free layer and pinned layer have a gradient of glassing agent concentration with a highest concentration in a middle region of the free layer and/or pinned layer to maintain an amorphous character in the middle region and thereby increase thermal stability of the magnetic device. In embodiments where more than one glassing agent is employed, glassing agent concentration is understood to mean the total concentration of all glassing agents in a certain region or layer. The engineered free layer and/or pinned layer preferably exhibit perpendicular surface anisotropy (PMA) and selectively crystallize at interfaces with a tunnel barrier layer and a second adjoining layer in the MTJ stack. The MTJ may be employed in a STT-MRAM or other spintronic device, in a logic device design, in a read head sensor, or as a propagation medium for a domain wall in a domain wall motion device. The terms interfacial perpendicular anisotropy and surface perpendicular anisotropy may be used interchangeably. The middle of the free layer or pinned layer is defined as a plane parallel to the substrate and essentially equidistant from top and bottom surfaces of the free layer wherein a top surface is defined as a surface facing away from the substrate and a bottom surface faces the substrate. One of the top and bottom surfaces forms a first interface with the adjoining tunnel barrier layer and the second surface forms a second interface with a perpendicular Hk enhancing layer on the opposite side of the free layer (or pinned layer) with respect to the tunnel barrier.

Figure 1A:
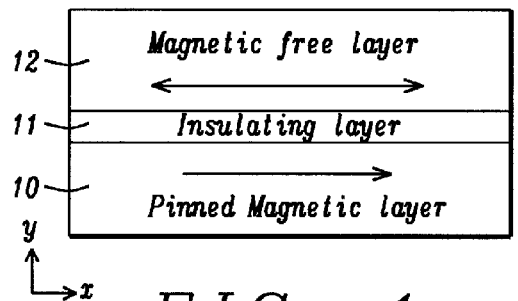
FIG. 1a and FIG. 1b are cross-sectional views showing a magnetic tunnel junction (MTJ) with in-plane magnetization and with out-of-plane magnetization, respectively.
Figure 1B:
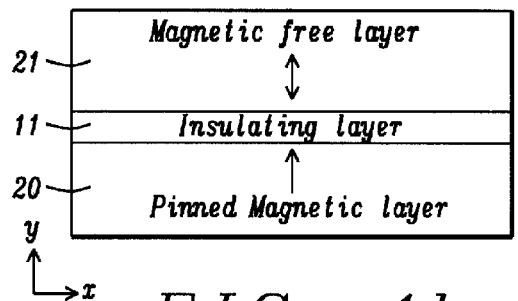
Figure 2:
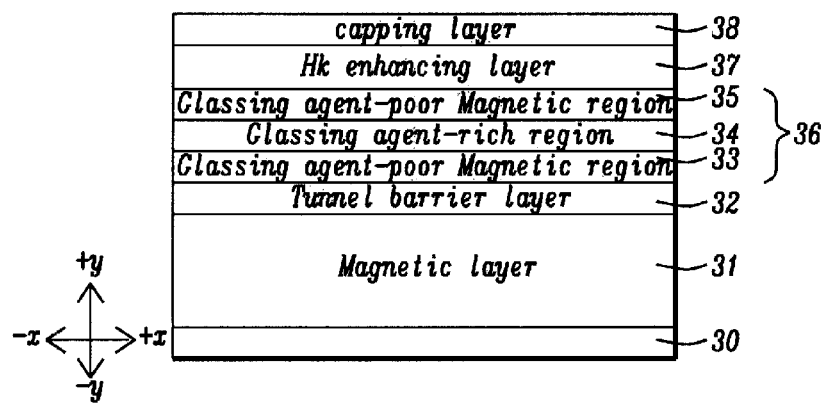
FIG. 2 is a cross-sectional view of a MTJ wherein a composite free layer has a first region with a first concentration of glassing agent adjoining a tunnel barrier layer, a second region with a second concentration of glassing agent that forms an interface with a perpendicular Hk enhancing layer, and a third region with a third concentration of glassing agent greater than the first and second concentrations formed between the first and second regions according to one embodiment of the present disclosure.

Referring to FIG. 2, a first embodiment of the present disclosure is depicted. A MTJ structure is shown wherein a pinned magnetic layer 31 or reference layer, tunnel barrier layer 32, free layer 36, perpendicular Hk enhancing layer 37, and capping layer 38 are sequentially formed on a substrate 30 that may be a seed layer in the MTJ stack, or a bottom electrode in a MRAM device, or a bottom shield in a sensor, for example. The pinned layer 31 may have in-plane magnetization and a synthetic anti-ferromagnetic (SAF) configuration (not shown) in which a first ferromagnetic layer also referred to as an AP2 layer adjoining the substrate has a magnetic moment in a "+x" direction, a second ferromagnetic layer also referred to as an AP1 layer adjoining the tunnel barrier has a magnetic moment aligned anti-parallel to that of the first ferromagnetic layer, and there is a coupling layer such as Ru formed between the AP1 and AP2 layers. In an alternative embodiment, the pinned layer has perpendicular magnetic anisotropy with a magnetization in the "+y" or "-y" direction and may be comprised of a laminate such as (Co/Ni)n or the like where "n" is the lamination number, a $L1_0$ ordered alloy, or a rare earth-transition metal (RE-TM) alloy as appreciated by those skilled in the art.

The tunnel barrier 32 may be made of MgO that is formed by depositing a first Mg layer on the pinned layer, performing a natural oxidation (NOX) or radical oxidation (ROX) process, and then depositing a second Mg layer on the oxidized first Mg layer. A subsequent annealing step after the remaining MTJ layers are laid down forms an essentially uniform MgO tunnel barrier layer wherein the second Mg layer in the tunnel barrier stack is oxidized by oxygen diffusion from the underlying MgO layer and by gettering oxygen from the free layer 36. In an alternative embodiment, the tunnel barrier layer is made of an oxide or nitride of one or more of Si, Ti, Ba, Ca, La, Mn, V, Al, Ti, Zn, Hf, Mg, Ta, Ti, B, Cu, and Cr. Furthermore, the tunnel barrier layer may be a laminate of one or more of the aforementioned oxide or nitride layers.

A key feature of the present disclosure is that the free layer 36 is engineered such that a first region 33 which forms a first interface with the tunnel barrier 32, and a second region 35 which forms a second interface with the perpendicular Hk enhancing layer are selectively crystallized during a subsequent annealing step once all of the MTJ layers have been deposited. Meanwhile, a middle or third region 34 maintains an amorphous character even after an elevated annealing treatment because the layer includes one or more glassing agents including a glassing agent (G) such as Si, Ta, P, Nb, Hf, Ti, Pd, Be, Cr, Zr, Cu, Os, V, or Mg in a concentration of 1% to 30%. As a result, the first and second regions have a lower crystallization temperature than that of the middle region. Preferably, the anneal temperature and the maximum temperature applied during subsequent processing is below the crystallization temperature of the middle region 34.

The free layer 36 preferably exhibits perpendicular magnetic anisotropy and is a ferromagnetic material that comprises an alloy of one or more of Co, Fe, and Ni with a thickness between 5 and 30 Angstroms. Optionally, the free layer may be a ferromagnetic material comprising an alloy of one or more of Co, Fe, Ni, and B with a thickness from 5 to 30 Angstroms. Thus, the third region 34 has a certain concentration of one or more glassing agents while first and second regions 33, 35, respectively, have a lower concentration of the one or more glassing agents than in the third region. The glassing agents suppresses crystallization and as a glassing agent concentration increases, the middle layer 34 which is preferably deposited as an amorphous film, retains the amorphous character even at annealing temperatures of up to 400° C. or higher. In an embodiment where B is used as a second glassing agent, the first glassing agent (G) concentration is smaller in the first and second regions than in the third region or layer 34, and the total concentration of glassing agents (B+G) is also less in the first and second regions than in the third region. In fact, glassing agent concentration (G) may be zero in the first and second regions 33, 35. Note that B is considered a high diffusing glassing agent meaning that diffusion within a ferromagnetic layer begins to occur around 240° C., while Ta is a low diffusing glassing agent and does not begin to diffuse until around 400° C.

There is strong perpendicular surface anisotropy at the first and second interfaces described above as a result of contact between a metal oxide (or metal nitride) and a metal layer. The total thickness (d parameter in equation 3) of the free layer 36 is thin enough so that the interfacial perpendicular anisotropy is significant compared with the shape anisotropy field. For example, the shape anisotropy field for a $Co_{20}Fe_{60}B_{20}$ free layer is approximately 12000 Oe. Depending on the composition of the engineered free layer 36, we have found interfacial perpendicular anisotropy may be greater than 12000 Oe by adjusting the thickness in a range of 5 to about 30 Angstroms. Under such conditions, an out-of-plane magnetization (PMA) is established in the free layer. When interfacial perpendicular anisotropy is less than the magnitude of the shape anisotropy field, the magnetization remains in the plane of the free layer. It should be understood that instead of an amorphous character, the middle region may be comprised of nano-crystals with a diameter less than about 10 Angstroms and with random magnetic moments such that the net magnetization of the middle region is essentially zero.

In other words, when a CoFe, or CoFeB layer, which normally has in-plane magnetization, adjoins an oxide layer such as MgO, the magnetization of the CoFe or CoFeB layers can be aligned out-of-plane under conditions where interfacial perpendicular anisotropy exceeds the shape anisotropy field for the magnetic layer. A Fe rich (Fe>Co content) CoFeB layer is preferred for a high MR ratio in a MgO/CoFeB tunnel barrier/free layer configuration. In an embodiment where the tunnel barrier is $Al_2O_3$, a Co rich alloy is preferred for the free layer.

In one aspect, the three regions of the free layer are distinct layers and one or more glassing agents are introduced into at least the third region or middle layer 34 by a co-sputtering deposition process. According to one scheme, a first CoFeB layer or CoFe alloy is sputter deposited in a chamber of an Anelva 7100 sputter deposition mainframe or the like to form the first region or bottom most layer 33 on the tunnel barrier layer 32. Then, two targets made of CoFeB and Ta, for example, may be co-sputtered to form a CoFeBTa layer 34 on layer 33. Alternatively, another glassing agent as described previously may be co-sputtered with a ferromagnetic alloy of one or more of Co, Fe, and Ni, or with an alloy of one or more of Co, Fe, Ni, and B to give a middle layer 34 with a CoFeG, CoFeNiG, CoBG, FeBG, CoFeBG, or CoFeNiBG composition wherein G is a first glassing agent and B is a second glassing agent. Finally, the second region or uppermost layer 35 comprised of CoFeB or CoFe alloy, for example, is sputter deposited on the middle layer. The present disclosure also anticipates that all three layers 33-35 may be deposited with at least two glassing agents. In this case, the glassing agent concentration [(B+G), or (G) only for a non-B alloy free layer] in the lower layer 33 and upper layer 35 is less than that in the middle layer 34. Moreover, at least one glassing agent may diffuse away from the first and second interfaces during an annealing process such that the glassing agent content (B+G) or (G) in the lower and upper layers 33, 35 increases with increasing distance from the first and second interfaces, respectively.

Figure 3:
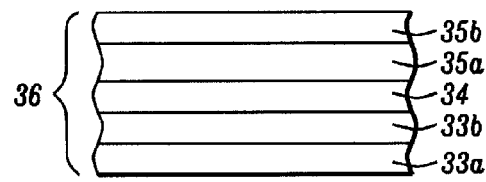
FIG. 3 is an enlarged cross-sectional view of the free layer in FIG. 2 wherein each of the first and second regions is comprised of a plurality of layers according to another embodiment of the present disclosure.

Referring to FIG. 3, the present disclosure also encompasses an embodiment wherein the free layer 36 comprises a plurality of layers such that each of the lower layer 33 and upper layer 35 are composites with up to n layers where n>1. In the exemplary embodiment, n=2 and lower layer 33 is a composite with a first layer 33a contacting the tunnel barrier layer 32 and a second layer 33b which contacts middle layer 34. Likewise, upper layer 35 is a composite with a first layer 35a contacting middle layer 34 and a second layer 35b which forms an interface with the perpendicular Hk enhancing layer (not shown). In this case, layers 33a, 35b have the lowest glassing agent concentration, and middle layer 34 has the highest glassing agent concentration in free layer 36. Layer 33b has a glassing agent content that is intermediate between that of layer 33a and layer 34. Similarly, layer 35a has a glassing agent content intermediate between that of middle layer 34 and layer 35b. Layers 33a, 33b, 34, 35a, and 35b are sequentially deposited on tunnel barrier 32. In one example, layers 33a, 35b are CoFeB layers, layers 33b, 35a have a CoFeBG composition with a first glassing agent concentration, and layer 34 has a CoFeBG composition with a second glassing agent concentration where the second concentration is greater than the first concentration. Alternatively, CoFeB may be replaced by an alloy of one or more of Co, Fe, Ni, and B in one or more of layers 33-35. It should be understood that there may be diffusion of glassing agent G from one layer into an adjoining layer during a subsequent annealing process. Thus, layers 33a, 35b may initially have no G content immediately after deposition but a certain amount of glassing agent from layers 33b, 35a may diffuse into the bottommost layer 33a and uppermost layer 35b, respectively, during a high temperature anneal process after all MTJ layers are deposited.

Returning to FIG. 2, in another embodiment, a glassing agent (G) is deposited in a separate process from the free layer ferromagnetic material deposition. Furthermore, one or more of the aforementioned glassing agents (G) may be deposited in a laminated configuration wherein each glassing agent layer is from 0.1 to 5 Angstroms thick. According to this embodiment, a first CoFeB layer or an alloy of one or more of Co, Fe, Ni, and B may be deposited on the tunnel barrier layer 32. Thereafter, one or more glassing agents are deposited in one or more layers to form a glassing agent layer or laminate on the first CoFeB layer or alloy layer. Finally, a second CoFeB layer or alloy of one or more of Co, Fe, Ni, and B is deposited on the glassing agent layer. During a subsequent anneal step after all of the MTJ layers are laid down, the one or more glassing agents (G) may form nano-crystals along the grain boundaries of the CoFeB or alloy layer. The nano-crystals in the middle region 34 have random magnetic moments and contribute essentially zero to the magnetization of free layer 36. Regions 33, 35 have a lower glassing agent concentration (G) or (B+G) than in the center or middle region 34. In another aspect, there may be a plurality of "m" sub-regions within each region 33, 35. In this case, the glassing agent concentration (G) or (B+G) may increase incrementally or gradually from a first concentration in a sub-region adjacent to the first and second interfaces to a second concentration in the middle region 34. When m=1, the free layer configuration may be represented by CoFeBG/G/CoFeBG or alloyG/G/alloyG where the alloy has a CoFe, CoFeNi, CoB, FeB, or CoFeNiB composition.

Figure 4:
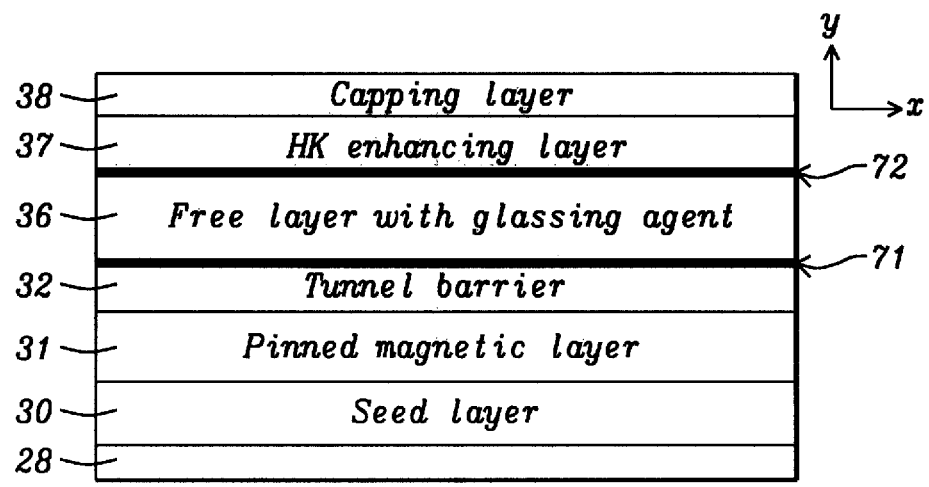
FIG. 4 is a cross-sectional view of a MTJ wherein a composite free layer as depicted in FIG. 2 is formed in a bottom spin valve structure according to a second embodiment of the present disclosure.

Referring to FIG. 4, an embodiment of the present disclosure is shown wherein the MTJ stack described previously is formed in a bottom spin valve configuration in which a seed layer 30, pinned layer 31, tunnel barrier 32, free layer 36, perpendicular Hk enhancing layer 37, and capping layer 38 are sequentially formed on a substrate 28 that may be a bottom electrode in a MRAM device or a bottom shield in a sensor. The seed layer 30 may be NiCr or other seed materials used in the art. Within the free layer 36, there is a gradual change in glassing agent concentration with the lowest concentration of glassing agent found proximate to the first interface 71 with the tunnel barrier layer and proximate to the second interface 72 with the perpendicular Hk enhancing layer. The glassing agent content gradually increases with increasing distance away from the interfaces 71, 72 so that the highest concentration is reached near the middle of free layer 36 and within the middle or third region 34 (FIG. 2).

Figure 5:
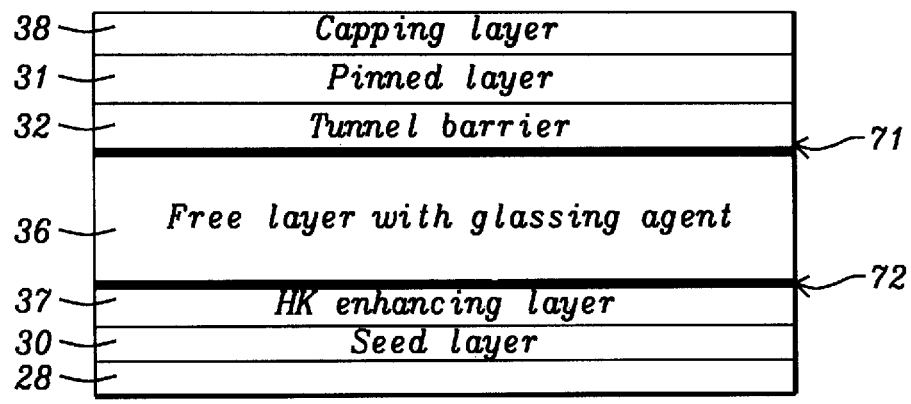
FIG. 5 is a cross-sectional view of a MTJ wherein a composite free layer with a gradient of glassing agent concentration is formed in a top spin valve configuration according to another embodiment of the present disclosure.

In all of the aforementioned embodiments, the perpendicular Hk enhancing layer 37 is made of a material that provides interfacial perpendicular anisotropy when contacting a top surface of free layer 36 as depicted in FIGS. 2, 3, or a bottom surface of the free layer in a top spin valve configuration shown in FIG. 5. In a preferred embodiment, the perpendicular Hk enhancing layer 37 is comprised of MgO having a thickness and oxidation state that are controlled to give a resistance×area (RA) product smaller than that of the MgO layer in the tunnel barrier layer 32 in order to minimize a reduction in the MR ratio (TMR ratio in a TMR configuration). In an alternative embodiment, the perpendicular Hk enhancing layer may be comprised of an oxide, nitride, or lamination of one or more oxide and/or nitrides of Si, Ti, Ba, Ca, La, Mn, V, Al, Ti, Zn, Hf, Mg, Ta, B, Cu, and Cr. In yet another embodiment, the perpendicular Hk enhancing layer may be one or more of Ta, Ti, B, Ag, Au, Cu, Cr, Nb, Zr, V, Mg and Al. Moreover, when the perpendicular Hk enhancing layer 37 is an oxide, the layer may be embedded with an alloy made of one or more of Fe, Co, Ni, and B to lower the resistivity therein. For instance, when the perpendicular Hk enhancing layer is comprised of SiOx or $Al_2O_3$, the embedded particles may be 20% to 45% by weight of the perpendicular Hk enhancing layer. The present disclosure also anticipates the perpendicular Hk enhancing layer may be a laminate that includes a plurality of oxide layers comprised of one or more of the oxides described above.

Figures 8, 9:
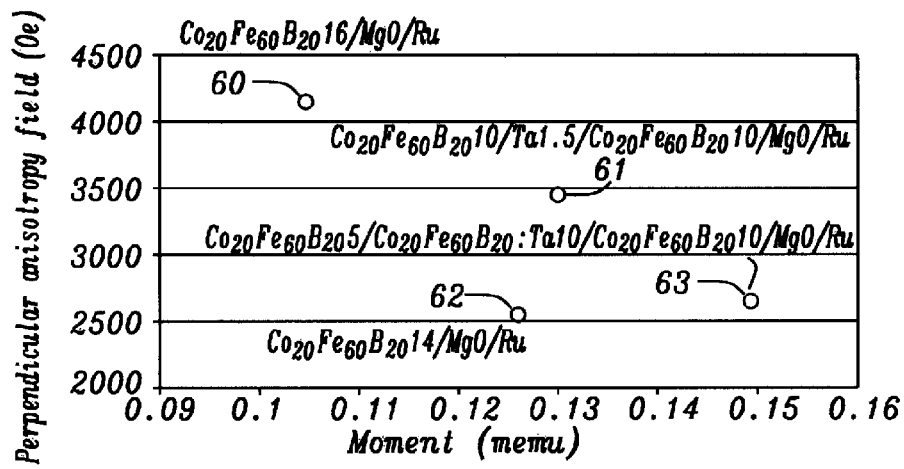
FIG. 8 is a plot of perpendicular magnetic anisotropy vs. magnetic moment for various free layer/perpendicular Hk enhancing layer/cap layer configurations.
FIG. 9 is a table that lists the free energy of oxide formation for different materials.

Another important feature of the aforementioned embodiments is the material selected for the capping layer 38. In a preferred embodiment, the capping layer is made of Ru. Alternatively, other elements may be chosen for the capping layer. However, materials with a substantially higher free energy of oxide formation compared with the free energy of the oxide employed in the perpendicular Hk enhancing layer 37 are most suitable. FIG. 9 lists the free energy of oxide formation of various elements. Note that if MgO is selected as the perpendicular Hk enhancing layer, a capping layer material having a free energy of oxide formation substantially higher than −1146 kJ./mole is preferred. Thus, elements near the top of the table in FIG. 9 are preferred over elements near the bottom of the table since the former have a less negative value (higher energy of oxide formation) than the latter. It follows that Ta is less desirable than Ru as the capping layer since Ta has an affinity for oxygen close to that of Mg which means oxygen is more likely to migrate from a MgO perpendicular Hk enhancing layer into a Ta capping layer than into a Ru capping layer during annealing. A loss of oxygen from an oxide perpendicular Hk enhancing layer lowers the interfacial perpendicular anisotropy at the interface with the free layer thereby reducing the induced PMA in the free layer 36. The largest advantage provided by a tunnel barrier layer/free layer/Hk enhancing layer/capping layer configuration according to the present disclosure occurs when the greatest amount of PMA is induced in the free layer as a result of the interfacial perpendicular anisotropy associated with the free layer interfaces 71, 72 mentioned previously. In an embodiment wherein the capping layer 38 is a composite as in Ru/Ta or Ru/Ta/Ru, the lowermost layer (not shown) contacting the Hk enhancing layer should have the high energy of oxide formation relative to an oxide perpendicular Hk enhancing layer.

Referring to FIG. 5, an embodiment is shown where the MTJ has a top spin valve configuration. All of the layers in the bottom spin valve embodiments (FIGS. 2-4) are retained except the order of deposition of the MTJ layers is changed. In one embodiment, a perpendicular Hk enhancing layer 37, free layer 36, tunnel barrier 32, pinned layer 31, and capping layer 38 are consecutively formed on a seed layer 30. The seed layer is made of a metal or alloy, preferably Ru that has a free energy of oxide formation substantially greater than that of the oxide selected for the perpendicular Hk enhancing layer. In an embodiment wherein the seed layer is a composite, the uppermost layer (not shown) contacting the perpendicular Hk enhancing layer should have a high energy of oxide formation relative to that of an oxide perpendicular Hk enhancing layer. The pinned layer 31 may have a SAF structure with an AP1/coupling/AP2 configuration where the AP1 layer contacts the tunnel barrier to improve thermal stability of the MTJ and also reduce the interlayer coupling Hin (offset) field applied to the free layer. In one embodiment, the AP2 and AP1 layers (not shown) are comprised of one or more of CoFe and CoFeB, and the coupling layer is Ru.

Figure 6:
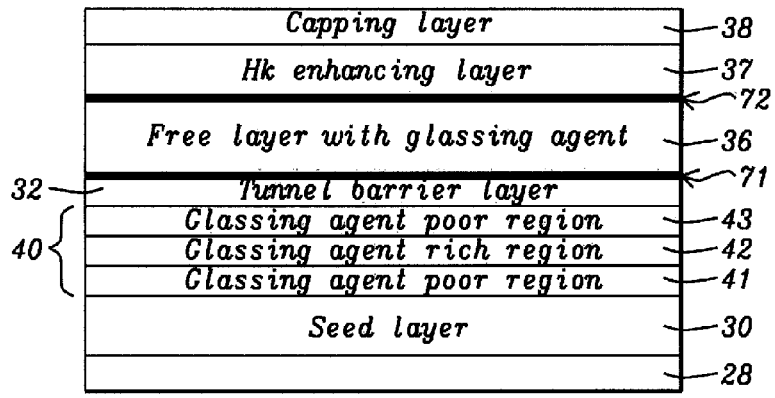
FIG. 6 is a cross-sectional view of a MTJ element wherein both of a free layer and pinned layer are composites comprised of a middle region with a higher concentration of glassing agent than in regions that form an interface with overlying and underlying layers according to another embodiment of the present disclosure.

Referring to FIG. 6, another embodiment of the present disclosure is depicted wherein a MTJ structure has a bottom spin valve configuration in which both of the free layer 36 and pinned layer 40 are comprised of one or more glassing agents, and preferably at least two glassing agents within each layer. The free layer 36 composition and interfaces 71, 72 with tunnel barrier layer and perpendicular Hk enhancing layer were previously described. In this case, the pinned layer 40 is comprised of at least three regions with a middle region 42 having a higher glassing agent concentration than that of lower region 41 and upper region 43. Glassing agent G is one of Si, Ta, P, Nb, Hf, Ti, Pd, Be, Cr, Zr, Cu, Os, V, or Mg and has a concentration from 1% to 30% in the pinned layer. In one aspect, B may be added as a second glassing agent in at least regions 33, 35 of the free layer and in regions 41, 43 of the pinned layer. Thus, the pinned layer 40 may be comprised of CoFeB or an alloy of one or more of Co, Fe, Ni, and B.

According to one embodiment, the three regions of the pinned layer 40 are distinct layers and the one or more glassing agents are introduced into at least the third region or middle layer 42 by a co-sputtering deposition process. Thus, a bottom layer 41 comprised of CoFeB or an alloy of one or more of Co, Fe, Ni, and B is deposited on a substrate such as a perpendicular Hk enhancing layer (not shown). Then, a glassing agent G as described previously may be co-sputtered with a ferromagnetic alloy of one or more of Co, Fe, and Ni, or with an alloy of one or more of Co, Fe, Ni, and B to give a middle layer 42 with a CoFeG, CoFeNiG, CoBG, FeBG, CoFeBG, or CoFeNiBG composition wherein G is a second glassing agent and B is a first glassing agent. Finally, the upper layer 43 comprised of CoFeB or an alloy of one or more of Co, Fe, Ni, and B, for example, is sputter deposited on the middle layer.

The present disclosure also anticipates that all three layers 41-43 may be deposited with at least two glassing agents. In this case, the glassing agent concentration in the lower layer 41 and upper layer 43 is less than that in the middle layer 42. Moreover, at least one glassing agent may diffuse away from the first and second interfaces during an annealing process such that the glassing agent content in the lower and upper layers 41, 43 increases with increasing distance from a first interface with the tunnel barrier layer and from a second interface with the perpendicular Hk enhancing layer. Also, each of the lower and upper layers 41, 43 may be comprised of a plurality of n layers as explained earlier with respect to layers 33, 35 in free layer 36.

In another embodiment, the one or more glassing agents may be deposited in a separate process from the pinned layer ferromagnetic material deposition. Furthermore, one or more of the aforementioned glassing agents may be deposited in a laminated configuration wherein each glassing agent layer is from 0.1 to 5 Angstroms thick. According to this embodiment, a first CoFeB layer or an alloy of one or more of Co, Fe, Ni, and B may be deposited on a perpendicular Hk enhancing layer. Thereafter, one or more glassing agents are deposited in one or more layers to form a glassing agent layer or laminate on the first CoFeB layer or alloy layer. Finally, a second CoFeB layer or alloy of one or more of Co, Fe, Ni, and B is deposited on the glassing agent layer. During a subsequent anneal step after all of the MTJ layers are laid down, one or more glassing agents from the middle glassing agent layer may diffuse into the adjoining CoFeB (or alloy) layers. In one embodiment, the glassing agent G in the middle glassing agent layer forms nano-crystals along the grain boundaries of the adjoining CoFeB or alloy layers. The nano-crystals have a net magnetic moment of essentially zero. As a result, the perpendicular interfacial anisotropy in the first and second regions (layers) near the first and second interfaces dominates the shape anisotropy field and PMA is established in the free layer 36 and in pinned layer 40. Furthermore, regions 41, 43 have a lower glassing agent concentration than in the center region 42. In this case, the pinned layer (and free layer) configuration may be represented by CoFeBG/G/CoFeBG or alloyG/G/alloyG where the alloy has a CoFe, CoFeNi, CoB, FeB, or CoFeNiB composition.

Figure 7:
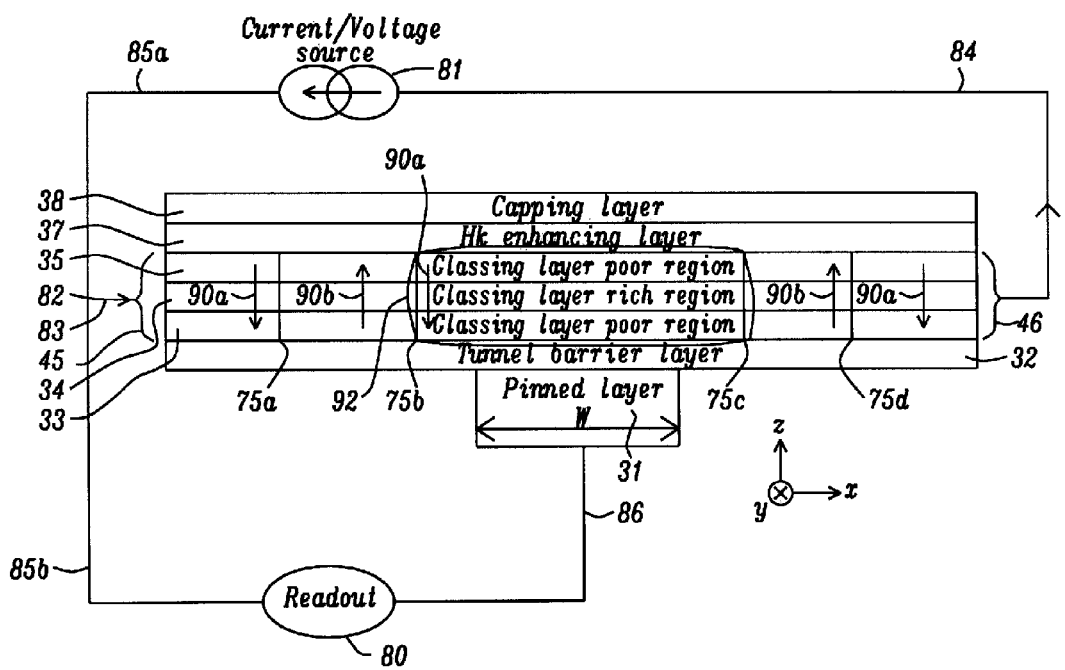
FIG. 7 is a cross-sectional view of a MTJ element including a free layer with a glassing agent concentration gradient that is formed in a domain wall motion device according to another embodiment of the present disclosure.

Referring to FIG. 7, another embodiment of the present disclosure is illustrated wherein the free layer 36 described in previous embodiments is part of a domain wall motion device. Pinned layer 31, tunnel barrier layer 32, perpendicular Hk enhancing layer 37, and capping layer 38 are also retained from previous embodiments. In one aspect, free layer 36 is comprised of regions 33-35 with a gradient of glassing agent concentration as described previously that increases from a second concentration at interfaces with layers 32, 37 to a first concentration at a middle region 34. In one aspect, the glassing agent concentration may increase in continuous increments from the second concentration to first concentration. Alternatively, regions 33-35 may be distinct layers such that free layer 36 is considered to be a composite structure. In the exemplary embodiment, the MTJ stack is shown with a bottom spin valve structure and has a pinned layer/tunnel barrier/free layer/perpendicular Hk enhancing layer/capping layer configuration. A key feature is that pinned layer 31 has a width along an in-plane x-axis direction that is substantially less than the width of the overlying stack of layers. In fact, the stack of layers including tunnel barrier 32, free layer 36 comprised of regions 33-35, perpendicular Hk enhancing layer 37, and capping layer 38 may be patterned to provide a wire which from a top-down view (not shown) is part of an array of wires that are employed for storage of digital information. Another important feature is that free layer 36 has a plurality of domain walls (75a-75d) each extending vertically from a top surface that forms a first interface with layer 37 to a bottom surface which forms a second interface with tunnel barrier layer 32. There is a magnetic domain bounded by each pair of domain walls within the free layer.

The number of domain walls is variable but is selected as four in the exemplary embodiment for illustrative purposes. In particular, the magnetic domain 92 aligned in a z-axis direction above pinned layer 31 has a switchable magnetization that changes from a (+) z-direction to a (−) z-direction or vice versa when a switching current is applied during a write process. Note that free layer has two ends 45, 46 connected to a current/voltage source 81 in a first electrical loop including wiring 85a to a junction 82 to wire 83 and to end 45, and a wire 84 attached to end 46 to enable a write process. Furthermore, there is a second electrical loop which allows a readout of digital information in the switchable magnetic domain 92 during a read process. Thus, current can be sent from source 81 through wires 85a, 85b and to readout 80 and then to wire 86 and through pinned layer 31, tunnel barrier 32, and the free layer before exiting end 46 and returning to the source to complete a circuit. In so doing, the readout device 80 is able to recognize whether the switchable magnetic domain 92 has a magnetization in a (+) z-axis direction 90b or in a (−) z-axis direction 90a.

Although only one MTJ element or only one domain wall motion device is pictured in the exemplary embodiments (FIGS. 2-7), it should be understood that typically an array of MTJ elements (or domain wall motion devices) are fabricated on a substrate. Moreover, the array of MTJ elements or the array of domain wall motion devices are connected by an array of wires that allow one or more of the MTJ elements or domain wall motion devices to be selectively written to or read to determine a memory state therein during a write process or read process, respectively. Thus, a top surface of a MTJ element (or domain wall motion device) may be connected to one or more adjacent MTJs (or domain wall motion devices) by one or more wires. In each case, the ferromagnetic or free layer serves as the storage layer since it is the magnetization direction of the ferromagnetic or free layer which determines whether the MTJ or domain wall motion device has a "0" or "1" magnetic state.

Referring to FIG. 8, a plot of perpendicular anisotropy field as a function of the magnetic moment of the free layer is illustrated as measured by a vibrating sample magnetometer (VSM). Full film MTJ samples were prepared by sequentially forming a 50 Angstrom thick layer Ta seed layer, 3 Angstrom thick CoFeB layer, MgO tunnel barrier, free layer, MgO perpendicular Hk enhancing layer, and a Ru capping layer on a Si/SiO$_2$ substrate. The thin CoFeB layer formed on the Ta layer serves as a seed layer for MgO formation. Thickness of the CoFeB layer is only 3 Angstroms to minimize any magnetic contribution to the MTJ stack. All samples were annealed at 300° C. for 1 hour. In samples 60 and 62, conventional free layers are formed as a 14 Angstrom thick $Co_{20}Fe_{60}B_{20}$ film and a 16 Angstrom thick $Co_{20}Fe_{60}B_{20}$ film, respectively, which serve as a reference. The free layer in sample 61 was prepared by sequentially depositing a first 10 Angstrom thick $Co_{20}Fe_{60}B_{20}$ film, a 1.5 Angstrom thick Ta layer (less than one monolayer), and then a second 10 Angstrom thick $Co_{20}Fe_{60}B_{20}$ film according to an embodiment described herein. The free layer in sample 63 was prepared by sequentially depositing a five Angstrom thick $Co_{20}Fe_{60}B_{20}$ film, a 10 Angstrom thick $Co_{20}Fe_{60}B_{20}$:Ta layer, and then a second $Co_{20}Fe_{60}B_{20}$ film that is 10 Angstroms thick according to another previously described embodiment. The middle layer contains about 20% Ta glassing agent. In all samples, the perpendicular interfacial anisotropy is strong enough to overcome the demagnetizing field so that the magnetization of the MTJ is pointing out of the plane of the film.

The data in FIG. 8 illustrate the benefit of a glassing agent (in this case Ta) in maintaining interfacial perpendicular anisotropy and reducing the crystalline anisotropy as a result of nano-crystalline character or an amorphous character in the middle layer of samples 61, 63, respectively. As a result, higher perpendicular anisotropy is achieved for a given magnetic moment. For example, MTJ samples 61 and 62 have nearly the same moment but MTJ 61 has a considerably higher perpendicular anisotropy field. Furthermore, a higher magnetic moment is realized at the same perpendicular anisotropy field as indicated by a comparison of MTJ sample 63 to MTJ 62.

All layers in the MTJs depicted in FIGS. 2, 4-7 may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. Once all of the layers in the MTJs are laid down on a substrate, a high temperature annealing may be performed in a vacuum oven at a temperature of about 300° C. to 400° C. Thereafter, an array of MTJ elements with substantially vertical sidewalls may be fabricated by a process involving a conventional photolithography patterning and ion etch sequence as is well known in the art and will not be described herein. Subsequently, an insulation layer may be deposited to electrically isolate adjacent MTJ elements. A chemical mechanical polish (CMP) process is typically employed to form a smooth surface of the insulation layer which becomes coplanar with a top surface of the MTJ array. Then additional metal levels such as a bit line layer may be formed on the MTJs to continue the fabrication of a magnetic device.

All of the embodiments described herein may be incorporated in a manufacturing scheme with standard tools and processes. In particular, a substantial gain in thermal stability by way of higher interfacial perpendicular anisotropy at a given magnetic moment is realized without sacrificing other performance characteristics such as MR ratio which is an important advantage in enabling high density STT-MRAM technology, and other magnetic devices where low switching current, low RA value, high MR ratio, and high thermal stability are critical parameters.

While this disclosure has been particularly shown and described with reference to, the preferred embodiment thereof, it will be understood by those skilled in the art that various changes in form and details may be made without departing from the spirit and scope of this disclosure.

We claim:

1. A magnetic tunnel junction (MTJ) element including a ferromagnetic layer with at least two interfaces that produce interfacial perpendicular anisotropy, comprising:
   (a) a tunnel barrier layer;
   (b) the ferromagnetic layer that has a first interface with said tunnel barrier layer and a second interface with a perpendicular Hk enhancing layer formed on a surface of the ferromagnetic layer that is opposite a surface adjoining the tunnel barrier layer, the ferromagnetic layer comprises a first glassing agent concentration in a middle portion thereof and a second glassing agent concentration less than the first glassing agent concentration but greater than zero in portions of the ferromagnetic layer proximate to the first and second interfaces; and
   (c) the perpendicular Hk enhancing layer.

2. The MTJ element of claim 1 wherein the glassing agent (G) is one or more of Si, Ta, P, Nb, Hf, Ti, Pd, Be, Cr, Zr, Cu, Os, V, or Mg to inhibit crystallization and maintain an amorphous character in the middle portion of the ferromagnetic layer.

3. The MTJ element of claim 2 wherein the ferromagnetic layer is comprised of an alloy of one or more of Co, Fe, and Ni, or an alloy of one or more of Co, Fe, Ni, and B, and is doped with a glassing agent (G) with a concentration of about 1% to 30% in the ferromagnetic layer.

4. The MTJ element of claim 3 wherein the ferromagnetic layer is a single layer or a laminated stack of layers comprised of an alloy of one or more of Co, Fe, Ni, and B with a thickness between about 5 and 30 Angstroms, or is an alloy of one or more of Co, Fe, and Ni with a thickness from about 5 and 30 Angstroms.

5. The MTJ element of claim 1 wherein the glassing agent concentration incrementally increases from the second concentration at the first and second interfaces to the first concentration in the middle portion of the ferromagnetic layer.

6. The MTJ element of claim 1 wherein the ferromagnetic layer is a composite of a plurality of layers in which one or more layers contain a glassing agent (G) and the layers adjoining the first and second interfaces have a smaller concentration of glassing agent (G) than a layer proximate to a middle of the ferromagnetic layer.

7. The MTJ element of claim 1 wherein the perpendicular Hk enhancing layer is comprised of an oxide, a nitride, or a lamination of oxide and/or nitride layers of one or more of Si, Ba, Ca, La, Mn, Zn, Hf, Ta, Ti, B, Cu, Cr, V, Mg, and Al, or is one of Ta, Ti, B, Ag, Au, Cu, Cr, Nb, Zr, V, Mg, or Al.

8. The MTJ element of claim 7 wherein the perpendicular Hk enhancing layer is embedded with magnetic particles of an alloy of one or more of Co, Fe, Ni, and B.

9. The MTJ element of claim 1 wherein the tunnel barrier layer is made of an oxide or nitride of one or more of Si, Ti, Ba, Ca, La, Mn, V, Al, Ti, Zn, Hf, Mg, Ta, Ti, B, Cu, and Cr.

10. The MTJ element of claim 1 wherein the interfacial perpendicular anisotropy dominates a shape anisotropy field of the ferromagnetic layer such that a magnetization direction is oriented out of the plane of the ferromagnetic layer.

11. The MTJ element of claim 10 wherein the ferromagnetic layer is a free layer and the magnetization direction of the free layer determines a "1" or "0" magnetic state in a memory device.

12. The MTJ element of claim 11 further comprised of a seed layer, pinned layer, and a capping layer in a bottom spin valve configuration wherein the seed layer, pinned layer, tunnel barrier layer, free layer, perpendicular Hk enhancing layer, and the capping layer are sequentially formed on a substrate.

13. The MTJ element of claim 12 wherein the pinned layer has an interface with the tunnel barrier layer and an interface with the seed layer, there is a first concentration of glassing agent in a middle portion of the pinned layer and a second concentration of glassing agent in portions of the pinned layer proximate to the interfaces with the tunnel barrier layer and seed layer.

14. The MTJ element of claim 11 further comprised of a seed layer, pinned layer, and a capping layer in a top spin valve configuration wherein the seed layer, perpendicular Hk enhancing layer, free layer, tunnel barrier layer, pinned layer, and the capping layer are sequentially formed on a substrate.

15. The MTJ element of claim 1 wherein a top surface of the MTJ element is connected to one or more other adjacent MTJ elements by one or more wires to form an array thereby enabling one or more of the MTJ elements to be selectively written to or read during a write process or read process, respectively.

16. A domain wall motion device, comprising:
(a) a pinned magnetic layer having a first width;
(b) a tunnel barrier contacting a top surface of the pinned layer;
(c) a free layer having a width substantially larger than the first width, and forming a first interface with the tunnel barrier layer and a second interface with a perpendicular Hk enhancing layer formed on a surface of the free layer that is opposite a surface at the first interface, there is a first glassing agent concentration in a middle portion of the free layer and a second glassing agent concentration less than the first glassing agent concentration but greater than zero in portions of the free layer proximate to the first and second interfaces, and wherein domain walls extend vertically between first and second interfaces to establish magnetic domains including a switchable magnetic domain aligned above the pinned magnetic layer;
(d) the perpendicular Hk enhancing layer; and
(e) a capping layer that contacts a top surface of the perpendicular Hk enhancing layer, the domain wall motion device is electrically connected to a current/voltage source and to a readout device to enable read and write processes.

17. The domain wall motion device of claim 16 wherein the glassing agent(G) is one or more of Si, Ta, P, Nb, Hf, Ti, Pd, Be, Cr, Zr, Cu, Os, V, or Mg to inhibit crystallization and maintain an amorphous character in the middle portion of the free layer.

18. The domain wall motion device of claim 17 wherein the free layer is comprised of an alloy of one or more of Co, Fe, and Ni, or an alloy of one or more of Co, Fe, Ni, and B, and is doped with a glassing agent (G) with a concentration of about 1% to 30% in the free layer.

19. The domain wall motion device of claim 17 wherein the free layer is a single layer or a laminated stack of layers comprised of an alloy of one or more of Co, Fe, Ni, and B with a thickness between about 5 and 30 Angstroms, or is an alloy of one or more of Co, Fe, and Ni with a thickness from about 5 and 30 Angstroms.

20. The domain wall motion device of claim 17 wherein the perpendicular Hk enhancing layer is comprised of an oxide, a nitride, or a lamination of oxide and/or nitride layers of one or more of Si, Ba, Ca, La, Mn, Zn, Hf, Ta, Ti, B, Cu, Cr, V, Mg, and Al, or is one of Ta, Ti, B, Ag, Au, Cu, Cr, Nb, Zr, V, Mg, or Al.

21. The domain wall motion device of claim 20 wherein the perpendicular Hk enhancing layer is embedded with magnetic particles of an alloy of one or more of Co, Fe, Ni, and B.

22. The domain wall motion device of claim 17 wherein the tunnel barrier layer is made of an oxide or nitride of one or more of Si, Ti, Ba, Ca, La, Mn, V, Al, Ti, Zn, Hf, Mg, Ta, Ti, B, Cu, and Cr.

23. The domain wall motion device of claim 17 wherein the interfacial perpendicular anisotropy dominates a shape anisotropy field of the free layer such that a magnetization direction is oriented out of the plane of the free layer.

24. The domain wall motion device of claim 17 wherein a top surface thereof is connected to one or more other adjacent domain wall motion devices by one or more wires to form an array thereby enabling one or more of the domain wall motion devices to be selectively written to or read during a write process or read process, respectively.

25. The domain wall motion device of claim 16 wherein a glassing agent content incrementally increases from the second concentration at the first and second interfaces to the first concentration in the middle portion of the free layer.

26. The domain wall motion device of claim 16 wherein the free layer is a composite of a plurality of layers in which one or more layers contain a glassing agent (G) and the layers adjoining the first and second interfaces have a smaller concentration of glassing agent (G) than that of a layer proximate to a middle of the free layer.

27. A method of forming a MTJ element exhibiting interfacial perpendicular anisotropy at a first interface between a free layer and an adjoining tunnel barrier layer and at a second interface between the free layer and an adjoining perpendicular Hk enhancing layer, comprising:
 (a) providing a pinned layer formed on a substrate;
 (b) forming a tunnel barrier layer on the pinned layer;
 (c) depositing a free layer having a bottom surface that forms a first interface with a top surface of said tunnel barrier, and having a top surface that forms a second interface with a subsequently deposited perpendicular Hk enhancing layer, the free layer comprises a first glassing agent concentration in a middle portion thereof that crystallizes at a first temperature, and a second glassing agent concentration less than the first concentration but greater than zero in top and bottom portions of the ferromagnetic layer proximate to the first and second interfaces such that the top and bottom portions crystallize at a second temperature less than the first temperature;
 (d) forming the perpendicular Hk enhancing layer on the free layer;
 (e) forming a capping layer that contacts a top surface of the perpendicular Hk enhancing layer; and
 (f) performing an anneal process.

28. The method of claim 27 wherein the anneal process is performed at a temperature that is less than the first temperature and greater than the second temperature.

29. The method of claim 27 wherein the glassing agent (G) is one or more of Si, Ta, P, Nb, Hf, Ti, Pd, Be, Cr, Zr, Cu, Os, V, or Mg, and is formed with a concentration between about 1% and 30% in the free layer.

30. The method of claim 29 wherein the free layer is a composite with a plurality of layers wherein one or more layers contain the glassing agent (G) and the layers adjoining the first and second interfaces have a smaller concentration of glassing agent (G) than that of a layer proximate to a middle of the free layer.

31. The method of claim 27 wherein the free layer is a single layer or a laminated stack of layers comprised of an alloy of one or more of Co, Fe, Ni, and B with a thickness between about 5 and 30 Angstroms, or is an alloy of one or more of Co, Fe, and Ni with a thickness from about 5 and 30 Angstroms.

32. The method of claim 27 wherein the perpendicular Hk enhancing layer is comprised of an oxide, a nitride, or a lamination of oxide and/or nitride layers of one or more of Si, Ba, Ca, La, Mn, Zn, Hf, Ta, Ti, B, Cu, Cr, V, Mg, and Al, or is one of Ta, Ti, B, Ag, Au, Cu, Cr, Nb, Zr, V, Mg, or Al.

33. A magnetic tunnel junction (MTJ) element including a ferromagnetic layer with at least two interfaces that produce interfacial perpendicular anisotropy, comprising:
 (a) a tunnel barrier layer;
 (b) the ferromagnetic layer that has a first interface with said tunnel barrier layer and a second interface with a perpendicular Hk enhancing layer formed on a surface of the ferromagnetic layer that is opposite a surface adjoining the tunnel barrier layer, the ferromagnetic layer comprises a first glassing agent (G) made of Si, Ta, P, Nb, Hf, Ti, Pd, Be, Cr, Zr, Cu, Os, V, or Mg, and a second glassing agent (B) wherein a first concentration of glassing agents (G+B) in a middle portion of the ferromagnetic layer is greater than a second concentration of glassing agents (G+B) in portions of the ferromagnetic layer proximate to the first and second interfaces; and
 (c) the perpendicular Hk enhancing layer.

34. The MTJ element of claim 33 wherein the first glassing agent has a greater concentration in the middle portion of the ferromagnetic layer than in portions proximate to the first and second interfaces.

35. The MTJ element of claim 33 wherein the second glassing agent begins to diffuse within the ferromagnetic layer at a temperature of about 240° C., and the first glassing agent begins to diffuse within the ferromagnetic layer at a temperature of about 400° C.

36. A magnetic tunnel junction (MTJ) element including a ferromagnetic layer with at least two interfaces that produce interfacial perpendicular anisotropy, comprising:
 (a) a tunnel barrier layer;
 (b) the ferromagnetic layer that has a first interface with said tunnel barrier layer and a second interface with a perpendicular Hk enhancing layer formed on a surface of the ferromagnetic layer that is opposite a surface adjoining the tunnel barrier layer, the ferromagnetic layer has a magnetic alloy/G/magnetic alloy configuration wherein a glassing agent (G) made of Si, Ta, P, Nb, Hf, Ti, Pd, Be, Cr, Zr, Cu, Os, V, or Mg has a first concentration in the G layer and a second concentration less than the first concentration in the alloy portions of the ferromagnetic layer proximate to the first and second interfaces, the glassing agent is deposited as a single layer or as a laminate wherein each glassing agent layer is from 0.1 to 5 Angstroms thick; and
 (c) the perpendicular Hk enhancing layer.

37. The MTJ of claim 36 wherein the magnetic alloy layers are comprised of one or more of Co, Fe, Ni, and B.

38. A domain wall motion device, comprising:
 (a) a pinned magnetic layer having a first width;
 (b) a tunnel barrier contacting a top surface of the pinned layer;
 (c) a free layer having a magnetic alloy/G/magnetic alloy configuration and a width substantially larger than the first width, and forming a first interface with the tunnel barrier layer and a second interface with a perpendicular Hk enhancing layer formed on a surface of the free layer that is opposite a surface at the first interface, there is a glassing agent (G) made of Si, Ta, P, Nb, Hf, Ti, Pd, Be, Cr, Zr, Cu, Os, V, or Mg with a first concentration in the middle G layer and with a second concentration less than the first concentration in the magnetic alloy portions of the free layer proximate to the first and second interfaces, the glassing agent is deposited as a single layer or as a laminate wherein each glassing agent layer is from 0.1 to 5 Angstroms thick, and wherein domain walls extend vertically between first and second interfaces to establish magnetic domains including a switchable magnetic domain aligned above the pinned magnetic layer;
 (d) the perpendicular Hk enhancing layer; and
 (e) a capping layer that contacts a top surface of the perpendicular Hk enhancing layer, the domain wall motion device is electrically connected to a current/voltage source and to a readout device to enable read and write processes.

39. The domain wall motion device of claim 38 wherein the magnetic alloy layers are comprised of one or more of Co, Fe, Ni, and B.

40. A method of forming a MTJ element exhibiting interfacial perpendicular anisotropy at a first interface between a ferromagnetic layer and an adjoining tunnel barrier layer and at a second interface between the ferromagnetic layer and an adjoining perpendicular Hk enhancing layer, comprising:
  (a) providing the tunnel barrier layer formed on a substrate;
  (b) depositing the ferromagnetic layer having a bottom surface that forms a first interface with a top surface of said tunnel barrier, and having a top surface that forms a second interface with a subsequently deposited perpendicular Hk enhancing layer, the ferromagnetic layer has a magnetic alloy/G/magnetic alloy configuration with a middle layer made of a glassing agent that is Si, Ta, P, Nb, Hf, Ti, Pd, Be, Cr, Zr, Cu, Os, V, or Mg with a first concentration that crystallizes at a first temperature, and wherein the magnetic alloy layers have a second glassing agent concentration less than the first concentration that crystallize at a second temperature less than the first temperature, and wherein the glassing agent (G) is deposited as a single layer or as a laminated configuration in which each glassing agent layer is from 0.1 to 5 Angstroms thick;
  (c) forming the perpendicular Hk enhancing layer on the ferromagnetic layer; and
  (d) performing an anneal process.

41. The method of claim 40 wherein the anneal process is performed at a temperature that is less than the first temperature and greater than the second temperature.

* * * * *